United States Patent
Xi et al.

(10) Patent No.: US 8,987,744 B2
(45) Date of Patent: Mar. 24, 2015

(54) THIN FILM TRANSISTOR

(71) Applicant: AU Optronics Corp., Hsin-Chu (TW)

(72) Inventors: Peng-Bo Xi, Hsin-Chu (TW); Yu-Chi Chen, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/450,289

(22) Filed: Aug. 4, 2014

(65) Prior Publication Data

US 2014/0339554 A1  Nov. 20, 2014

Related U.S. Application Data

(62) Division of application No. 13/858,090, filed on Apr. 7, 2013, now Pat. No. 8,835,929.

(30) Foreign Application Priority Data

Sep. 20, 2012  (TW) ............................ 101134415 A

(51) Int. Cl.
  *H01L 29/04* (2006.01)
  *H01L 27/12* (2006.01)
  *H01L 27/06* (2006.01)
  *H01L 29/786* (2006.01)

(52) U.S. Cl.
  CPC ........ *H01L 27/1255* (2013.01); *H01L 27/0629* (2013.01); *H01L 27/1225* (2013.01); *H01L 27/12* (2013.01); *H01L 29/786* (2013.01)
  USPC .............................................. 257/59; 257/57

(58) Field of Classification Search
  USPC ................................................... 257/57, 59
  See application file for complete search history.

(56) References Cited

U.S. PATENT DOCUMENTS

| | | | |
|---|---|---|---|
| 5,546,205 A * | 8/1996 | Sukegawa et al. | 349/46 |
| 5,561,381 A | 10/1996 | Jenkins | |
| 5,668,650 A * | 9/1997 | Mori et al. | 349/42 |
| 6,274,884 B1 | 8/2001 | Lee | |
| 7,250,992 B2 | 7/2007 | Lai | |
| 7,408,198 B2 * | 8/2008 | Liu | 257/72 |
| 7,550,308 B2 | 6/2009 | Yoshinaga | |
| 7,883,921 B2 | 2/2011 | Huh | |
| 8,089,572 B2 | 1/2012 | Yen | |
| 8,188,518 B2 | 5/2012 | Liu | |
| 2006/0113918 A1 | 6/2006 | Lo | |
| 2007/0153144 A1* | 7/2007 | Lai | 349/38 |
| 2011/0215319 A1 | 9/2011 | Yamazaki | |

* cited by examiner

*Primary Examiner* — Daniel Whalen
(74) *Attorney, Agent, or Firm* — Winston Hsu; Scott Margo

(57) ABSTRACT

A thin-film transistor includes a gate electrode, a capacitance compensation structure, a semiconductor layer, a dielectric layer, a drain electrode and a source electrode. The capacitance compensation structure is disposed on the substrate and electrically connected to the gate electrode. The capacitance compensation structure has a first side facing the gate electrode and a second side facing away from the gate electrode. The semiconductor layer covers a portion of the gate electrode, and at least extends to overlap the first side of the capacitance compensation structure. The dielectric layer has a first opening and a second opening. Both of the first opening and the second opening expose a portion of the semiconductor layer overlapping the gate electrode respectively. The drain electrode is in contact with the semiconductor layer though the first opening. The source electrode is in contact with the semiconductor layer though the second opening.

7 Claims, 7 Drawing Sheets

THIN FILM TRANSISTOR

CROSS REFERENCE TO RELATED APPLICATIONS

This application is a divisional of application Ser. No. 13/858,090 filed Apr. 7, 2013, now allowed, which is incorporated by reference herein in its entirety.

BACKGROUND OF THE INVENTION

1. Field of the Invention

The present disclosure relates to a pixel structure and a thin film transistor, and more particularly, to the pixel structure and the thin film transistor with a capacitance compensation structure.

2. Description of the Prior Art

An active matrix display panel includes a plurality of pixel structures arranged in an array. Each of the pixel structures basically includes thin-film transistors, display devices, storage capacitors, etc. In the methods of fabricating the thin-film transistors, the display devices, the storage capacitors and other components of the display panel, multi-layer films—which comprise, for example, conductive layers, semiconductor layers and dielectric layers—are layered by deposition processes, lithography processes, etching processes, etc., in sequence. However, misalignments occur inevitably in the lithography processes, thereby leading to relative position errors of the components fabricated in each layer. Especially for large-size display panels, since the size of masks is smaller than the size of the substrate of the display panel, the final patterns of one layer must be formed after thousands of lithography processes. In this condition, even in one display panel, the property of thin-film transistors and the storage capacitance of pixel structures may vary from region to region owing to misalignments; accordingly, display quality suffers.

SUMMARY OF THE INVENTION

It is one of the objectives of the disclosure to provide a pixel structure and a thin film transistor with a capacitance compensation structure.

An embodiment of the present disclosure provides a pixel structure. The pixel structure includes a first thin-film transistor, a second thin-film transistor and a storage capacitor. The first thin-film transistor has a first gate electrode, a first source electrode, a first drain electrode and a first semiconductor layer. The first source electrode and the first drain electrode are in contact with the first semiconductor layer. The second thin-film transistor has a second gate electrode, a second source electrode, a second drain electrode and a second semiconductor layer. The second source electrode and the second drain electrode are in contact with the second semiconductor layer. The second gate electrode has a first side facing the first gate electrode and a second side facing away from the first gate electrode. The second gate electrode is connected to the first source electrode. The second semiconductor layer has a first protruding portion protruding from the first side of the second gate electrode along a first direction and a second protruding portion protruding from the second side of the second gate electrode along the first direction. The area of the first protruding portion is substantially less than the area of the second protruding portion. The second semiconductor layer is not in contact with the first semiconductor layer. The storage capacitor has an upper electrode, a lower electrode and an insulation layer interposed between the upper electrode and the lower electrode. The second source electrode and a portion of the second semiconductor layer constitute the upper electrode. A portion of the second gate electrode constitutes the lower electrode. the insulation layer is further disposed between the first gate electrode of the first thin-film transistor and the first semiconductor layer of the first thin-film transistor and between the second gate electrode of the second thin-film transistor and the second semiconductor layer of the second thin-film transistor.

Another embodiment of the present disclosure provides a thin-film transistor. The thin-film transistor includes a gate electrode, a capacitance compensation structure, a semiconductor layer, a dielectric layer, a drain electrode and a source electrode. The gate electrode is disposed on a substrate and connected to a gate line. The capacitance compensation structure is disposed on the substrate. The capacitance compensation structure is electrically connected to the gate electrode. The capacitance compensation structure has a first side facing the gate electrode and a second side facing away from the gate electrode. The semiconductor layer is disposed on the substrate. The semiconductor layer covers a portion of the gate electrode. The semiconductor layer at least extends to overlap the first side of the capacitance compensation structure. The dielectric layer is disposed on the substrate. The dielectric layer has a first opening and a second opening. Both of the first opening and the second opening expose a portion of the semiconductor layer overlapping the gate electrode respectively. The drain electrode is disposed on the substrate and is in contact with the semiconductor layer though the first opening. The source electrode is disposed on the substrate and is in contact with the semiconductor layer though the second opening.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present disclosure, features of the embodiments will be made in detail. The embodiments of the present disclosure are illustrated in the accompanying drawings with numbered elements. In addition, the terms such as "first" and "second" described in the present disclosure are used to distinguish different components or processes, which do not limit the sequence of the components or processes.

Figure 1:
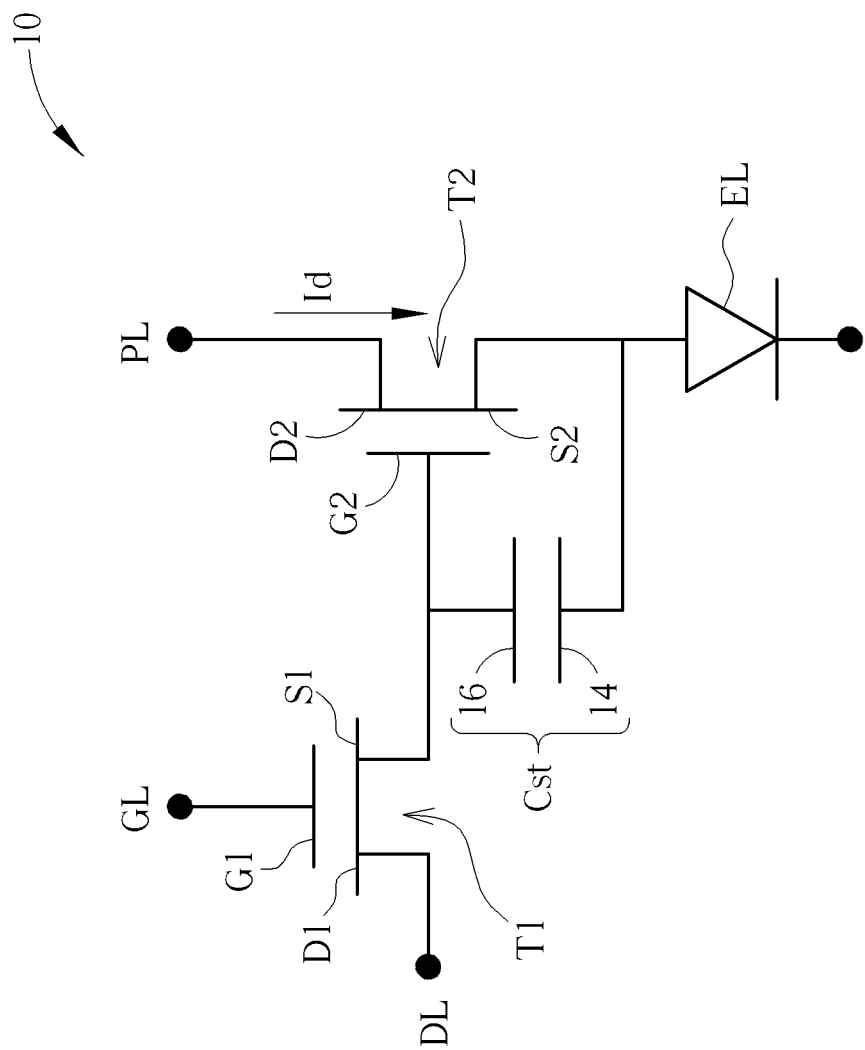
FIG. 1 is a schematic diagram illustrating an equivalent circuit of a pixel structure according to a first embodiment of the present disclosure.
Figure 2:
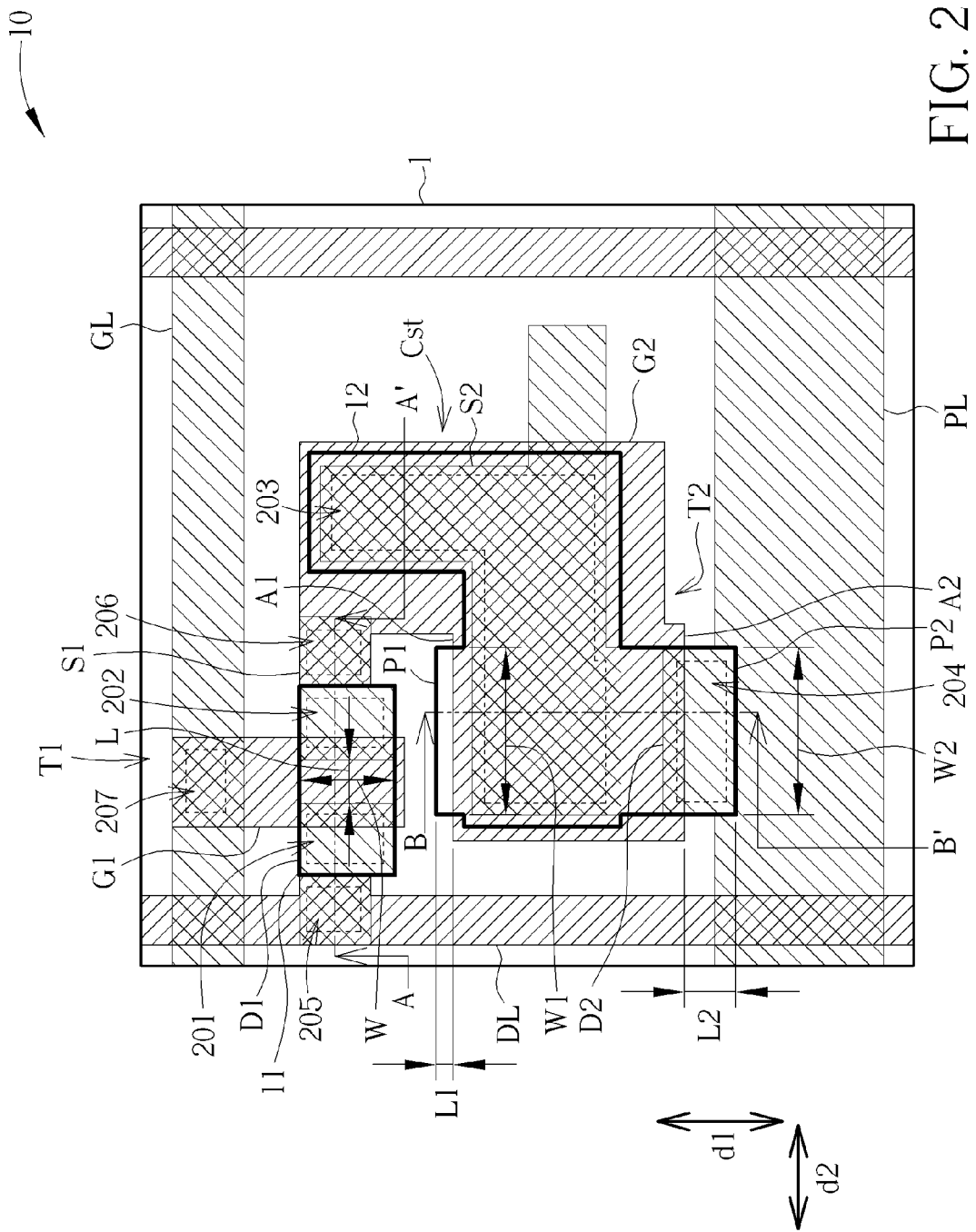
FIG. 2 is a top-view schematic diagram illustrating the pixel structure according to the first embodiment of the present disclosure.
Figure 3:
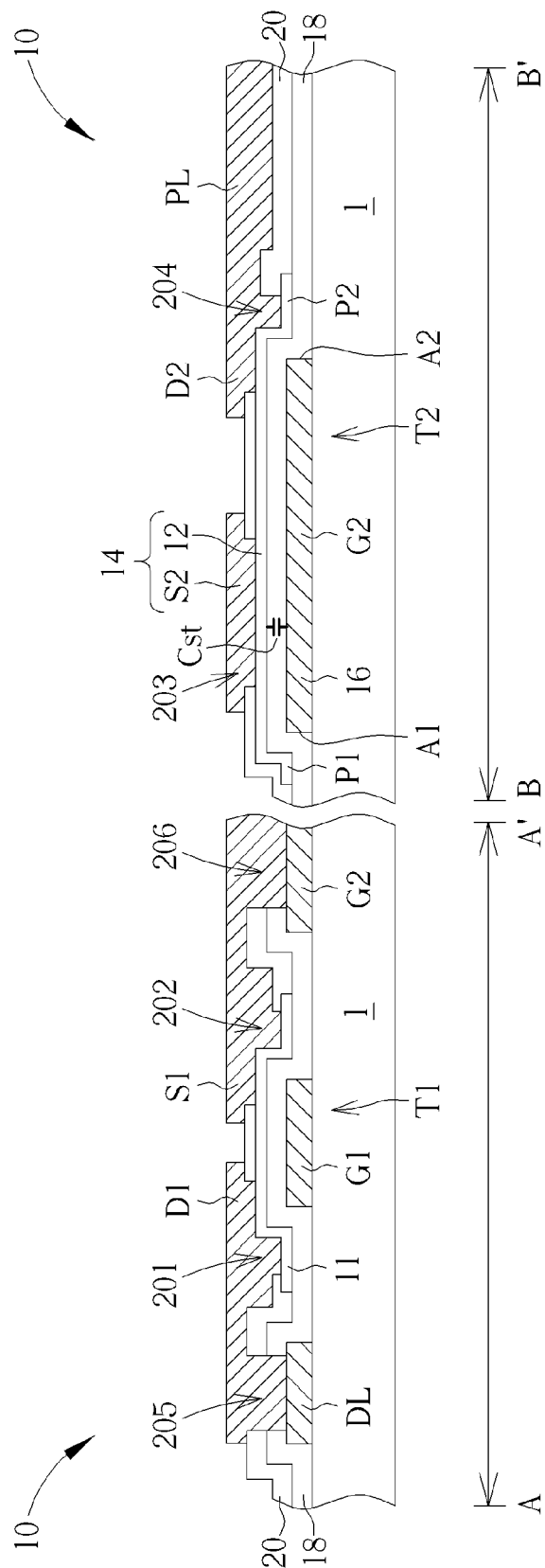
FIG. 3 is a cross-sectional view diagram taken along cross-sectional lines, A-A' and B-B', in FIG. 2.

Refer to FIGS. 1-3. FIG. 1 is a schematic diagram illustrating an equivalent circuit of a pixel structure according to a first embodiment of the present disclosure. FIG. 2 is a top-view schematic diagram illustrating the pixel structure according to the first embodiment of the present disclosure. FIG. 3 is a cross-sectional view diagram taken along cross-sectional lines, A-A' and B-B', in FIG. 2. Preferably, the pixel structure in the present disclosure is exemplarily embodied as the pixel structure of self-luminous display panels, such as organic electroluminescent display panels, but not limited thereto. The pixel structure in the present disclosure may also be exemplarily embodied as other types of self-luminous display panels, for example but not limited to, inorganic electroluminescent display panels, plasma display panels, field emission display panels or other suitable pixel structures of display panels. The pixel structure in the present disclosure may further be exemplarily embodied as non-self-luminous display panels, for example but not limited to, liquid crystal display (LCD) panels (such as horizontal electric field type liquid crystal display panels, vertical electric field type liquid crystal display panels, optically compensated bend (OCB) liquid crystal display panels, cholesteric liquid crystal displays, blue phase liquid crystal displays, or other suitable liquid crystal display panels), electro-phoretic display panels, electrowetting display panels, or other suitable pixel structures of display panels. It is worth noting that an extra backlight module is necessary for providing light to a non-self-luminous display panel; on the other hand, since a self-luminous display panel emits light spontaneously, no additional light source is required.

As shown in FIG. 1, the pixel structure 10 includes a first thin-film transistor T1, a second thin-film transistor T2 and a storage capacitor Cst. The first thin-film transistor T1, the second thin-film transistor T2 and the storage capacitor Cst are disposed on the substrate 1. The pixel structure 10 in this embodiment is exemplarily embodied as the pixel structure of a 2T1C structure. In other words, simply one storage capacitor and two thin-film transistors constitute the pixel structure. The first thin-film transistor T1 serves as a switch thin-film transistor, while the second thin-film transistor T2 serves as a driving thin-film transistor, but not limited thereto. In other variant embodiments, the pixel structure may be a structure with two more thin-film transistors, such as a 4T2C structure, a 2T2C structure, a 5T1C structure, a 6T1C structure or other structures. As shown in FIGS. 2-3, the first thin-film transistor T1 has a first gate electrode G1, a first source electrode S1, a first drain electrode D1 and a first semiconductor layer 11. The first source electrode S1 and the first drain electrode D1 are in contact with the first semiconductor layer 11. The second thin-film transistor T2 has a second gate electrode G2, a second source electrode S2, a second drain electrode D2 and a second semiconductor layer 12. The second source electrode S2 and the second drain electrode D2 are in contact with the second semiconductor layer 12. The second gate electrode G2 has a first side A1 and a second side A2. The first side A1 faces the first gate electrode G1, and the second side A2 is facing away from the first gate electrode G1. In other words, the first side A1 is closer to (or namely more near to) the first gate electrode G1 than other portions of the second gate electrode G2, such as a spacing exists between the first side and the first gate electrode G1 and other spacings exist between other portions of the second gate electrode G2, and the spacing is greater than the other spacings. The second gate electrode G2 is connected to the first source electrode S1. The second semiconductor layer 12 has a first protruding portion P1 and a second protruding portion P2. The first protruding portion P1 protrudes from the first side A1 of the second gate electrode G2 along a first direction d1, and the second protruding portion P2 protrudes from the second side A2 of the second gate electrode G2 along the first direction d1. The area of the first protruding portion P1 is substantially less than the area of the second protruding portion P2. The second semiconductor layer 12 is not in contact with the first semiconductor layer 11. Moreover, the storage capacitor Cst has an upper electrode 14, a lower electrode 16 and an insulation layer 18. The insulation layer 18 is interposed between the upper electrode 14 and the lower electrode 16. The second source electrode S2 and a portion of the second semiconductor layer 12 constitute the upper electrode 14. A portion of the second gate electrode G2 constitutes the lower electrode 16. The insulation layer 18 serves as a capacitive dielectric layer. Since the second semiconductor layer 12 of the upper electrode 14 is closer to the lower electrode 16 than the second source electrode S2 is, the capacitance of the storage capacitor Cst mainly depends on the overlapping area between the second semiconductor layer 12 of the upper electrode 14 and the lower electrode 16 (i.e. the second gate electrode G2) rather than the overlapping area between the second source electrode S2 of the upper electrode 14 and the lower electrode 16 (i.e. the second gate electrode G2). The material of the first semiconductor layer 11 and the second semiconductor layer 12 is preferably exemplarily embodied as oxide semiconductors, such as indium gallium zinc oxide (IGZO), indium gallium oxide (IGO), indium zinc oxide (IZO), indium tin oxide (ITO), titanium oxide (TiO), zinc oxide (ZnO), indium oxide (InO), gallium oxide (GaO) or other suitable materials. It is because the properties of oxide semiconductors are more similar to the properties of conductor than the properties of other semiconductors (such as amorphous silicon or polysilicon) that the upper electrode 14, which serves as the storage capacitor Cst, has higher conductivity. Preferably, the material of the first semiconductor layer 11 and the second semiconductor layer 12 in the present disclosure is exemplarily embodied as indium gallium zinc oxide. However, the material of the first semiconductor layer 11 and the second semiconductor layer 12 is not limited to oxide semiconductors—for example, the material of the first semiconductor layer 11 and the second semiconductor layer 12 may also be exemplarily embodied as amorphous semiconductors, polycrystalline semiconductors, microcrystalline semiconductors, single crystalline semiconductors, nanocrystalline semiconductors, organic semiconductors, other suitable semiconductors material or the combination thereof. The material of the insulation layer 18 may be exemplarily embodied as all kinds of inorganic isolation materials, organic isolation materials or the mixtures of inorganic isolation materials and organic isolation materials. Moreover, the insulation layer 18 is further disposed between the first gate electrode G1 of the first thin-film transistor T1 and the first semiconductor layer 11 of the first thin-film transistor T1 and between the second gate electrode G2 of the second thin-film transistor T2 and the second semiconductor layer 12 of the second thin-film transistor T2 so as to serve as a gate insulation layer.

In this embodiment, the first semiconductor layer 11 of the first thin-film transistor T1 has a channel length L and a channel width W. The channel length L is defined as the length of the first semiconductor layer 11 in the current direction (or the direction of the flow of negative charges, i.e. electrons). In other words, the channel length L is the length of the first semiconductor layer 11 between the first source electrode S1 and the first drain electrode D1, and the channel width W is the width of the first semiconductor layer 11 in the direction substantially perpendicular to the channel length L substantially. In the similar way, the directions of the channel length and the channel width of the second semiconductor layer 12 of the second thin-film transistor T2 can also be defined. In this embodiment, the direction of the channel width W is substantially parallel to the first direction d1. The first gate electrode G1 of the first thin-film transistor T1 is connected to a gate line GL. The first drain electrode D1 of the first thin-film transistor T1 is connected to a data line DL. The second drain electrode D2 of the second thin-film transistor T2 is connected to a power line PL. The pixel structure 10 further includes a photoelectric conversion device EL, for example, an organic light-emitting diode device (as shown in FIG. 1). The photoelectric conversion device EL is connected to the second source electrode S2 of the second thin-film transistor T2. In this embodiment, the first gate electrode G1 is a rectangle with two mutually corresponding short sides and two mutually corresponding long sides. One of the short sides is connected to the gate line GL, while the other one faces the second gate electrode G2. Moreover, the first protruding portion P1 of the second semiconductor layer 12 of the second thin-film transistor T2 faces the latter short side of the first gate electrode G1; in other words, the first protruding portion P1 is near the first gate electrode G1, and the second protruding portion P2 is facing away from the first gate electrode G1. The first protruding portion P1 has a first length L1 and a first width W1. The second protruding portion P2 has a second length L2 and a second width W2. The first width W1 of the first protruding portion P1 substantially equals the second width W2 of the second protruding portion P2. The first length L1 of the first protruding portion P1 protruding from the first side A1 of the second gate electrode G2 is substantially less than the second length L2 of the second protruding portion P2 protruding from the second side A2 of the second gate electrode G2. The first length L1 of the first protruding portion P1 is preferably greater than the misalignments of the second semiconductor layer 12 such as offsets. For example, in this embodiment, the first length L1 is substantially in a range between 1 micrometer and 5 micrometers. Preferably, the first length L1 is substantially in a range between 1 micrometer and 3 micrometers. Even more preferably, the first length L1 is substantially 2 micrometers. The first length L1 is substantially in a range between 2 micrometers and 5 micrometers, but not limited thereto. The second length L2 is substantially in a range between 1 micrometer and 5 micrometers, but not limited thereto. The second length L2 is substantially greater than the first length L1. Moreover, in the second direction d2 perpendicular to the first direction d1, the second gate electrode G2 protrudes from the two opposite sides of the second semiconductor layer 12. The protruding length of the second gate electrode G2 from the second semiconductor layer 12 is preferably greater than the misalignments of the second semiconductor layer 12.

In this embodiment, the first gate electrode G1, the second gate electrode G2 and the data line DL are formed from the same patterned conductive layer, for example, the first metallic layer (M1). The first source electrode S1, the first drain electrode D1, the second source electrode S2, the second drain electrode D2, the gate line GL and the power line PL are formed from another patterned conductive layer, for example, the second metallic layer (M2), but not limited thereto. For example, in other variant embodiments, the first gate electrode G1, the second gate electrode G2, the gate line GL and the power line PL may be formed from the same patterned conductive layer, for example, the first metallic layer (M1), while the first source electrode S1, the first drain electrode D1, the second source electrode S2, the second drain electrode D2 and the data line DL may be formed from another patterned conductive layer, for example, the second metallic layer (M2). The first thin-film transistor T1, the second thin-film transistor T2 and the storage capacitor Cst further include a dielectric layer 20. The dielectric layer 20 is disposed on the insulation layer 18 of the first thin-film transistor T1, on the insulation layer 18 of the second thin-film transistor T2 and on the insulation layer 18 of the storage capacitor Cst. The dielectric layer 20 covers the first semiconductor layer 11 and the second semiconductor layer 12 so as to avoid damage to the first semiconductor layer 11 and the second semiconductor layer 12 when the first source electrode S1, the first drain electrode D1, the second source electrode S2 and the second drain electrode D2 are etching. The material of the dielectric layer 20 may be all kinds of inorganic isolation materials, organic isolation materials or the mixtures of inorganic isolation materials and organic isolation materials. The dielectric layer 20 has a plurality of openings 201, 202, 203, 204, 205, 206 and 207. The openings 201 and 202 expose a portion of the first semiconductor layer 11 of the first thin-film transistor T1 respectively. As a result, the first source electrode S1 and the first drain electrode D1 are in contact with the first semiconductor layer 11 through the openings 201 and 202 respectively. The openings 203 and 204 expose a portion of the second semiconductor layer 12 of the second thin-film transistor T2 and a portion of the second semiconductor layer 12 of the storage capacitor Cst respectively. As a result, the second source electrode S2 and the second drain electrode D2 are in contact with the second semiconductor layer 12 through the openings 203 and 204 respectively. The opening 205 penetrates the insulation layer 18 to expose the data line DL. As a result, the first drain electrode D1 is in contact with the data line DL through the opening 205 respectively. The opening 206 penetrates the insulation layer 18 to expose the second gate electrode G2. As a result, the first source electrode S1 is in contact with the second gate electrode G2 through the opening 206 respectively. The opening 207 penetrates the insulation layer 18 to expose the first gate electrode G1. As a result, the gate line GL is in contact with the first gate electrode G1 through the opening 207 (not shown in FIG. 3) respectively.

As shown in FIG. 1, in the pixel structure 10, the brightness of the photoelectric conversion device EL mainly depends on the current Id flowing through the second thin-film transistor T2. The current Id mainly depends on the voltage difference (Vgs) between the second gate electrode G2 of the second thin-film transistor T2 and the first source electrode S1 of the first thin-film transistor T1. Therefore, as the capacitance of the storage capacitor Cst (i.e. the mutual capacitance between the second gate electrode G2 and the first source electrode S1) changes, the voltage difference (Vgs) between the second gate electrode G2 and the first source electrode S1 will be affected—thereby influencing the current Id flowing through the second thin-film transistor T2. Accordingly, the brightness of the photoelectric conversion device EL will change. In other words, if all the photoelectric conversion devices EL are required to provide even and stable brightness, the capacitance of the storage capacitor Cst must keep steady. In this embodiment, both the first protruding portion P1 of the second semiconductor layer 12 and the second protruding portion P2 of the second semiconductor layer 12 serve as the capacitance compensation structure. The first protruding portion P1 protrudes from the first side A1 of the second gate electrode G2 along a first direction d1, and the second protruding portion P2 protrudes from the second side A2 of the second gate electrode G2 along the first direction d1. Both the first length L1 of the first protruding portion P1 and the second length L2 of the second protruding portion P2 are greater than the misalignments of the second semiconductor layer 12. Therefore, even if there is a variation in the position of the second semiconductor layer 12 in the first direction d1 owing to fabrication misalignments, the overlapping area between the second semiconductor layer 12 and the second gate electrode G2 can remain constant. Moreover, in the second direction d2, the second gate electrode G2 protrudes from the two opposite sides of the second semiconductor layer 12. The protruding length of the second gate electrode G2 from the second semiconductor layer 12 is preferably greater than the misalignments of the second semiconductor layer 12. Therefore, even if there is a variation in the position of the second semiconductor layer 12 in the second direction d2 owing to fabrication misalignments, the overlapping area between the second semiconductor layer 12 and the second gate electrode G2 can remain constant. In addition, the opening 204, which is used to connect the second drain electrode D2 to the second semiconductor layer 12, locates within the second protruding portion P2, and therefore the second length L2 of the second protruding portion P2 is preferably greater than the size of the opening 204.

Figure 4:
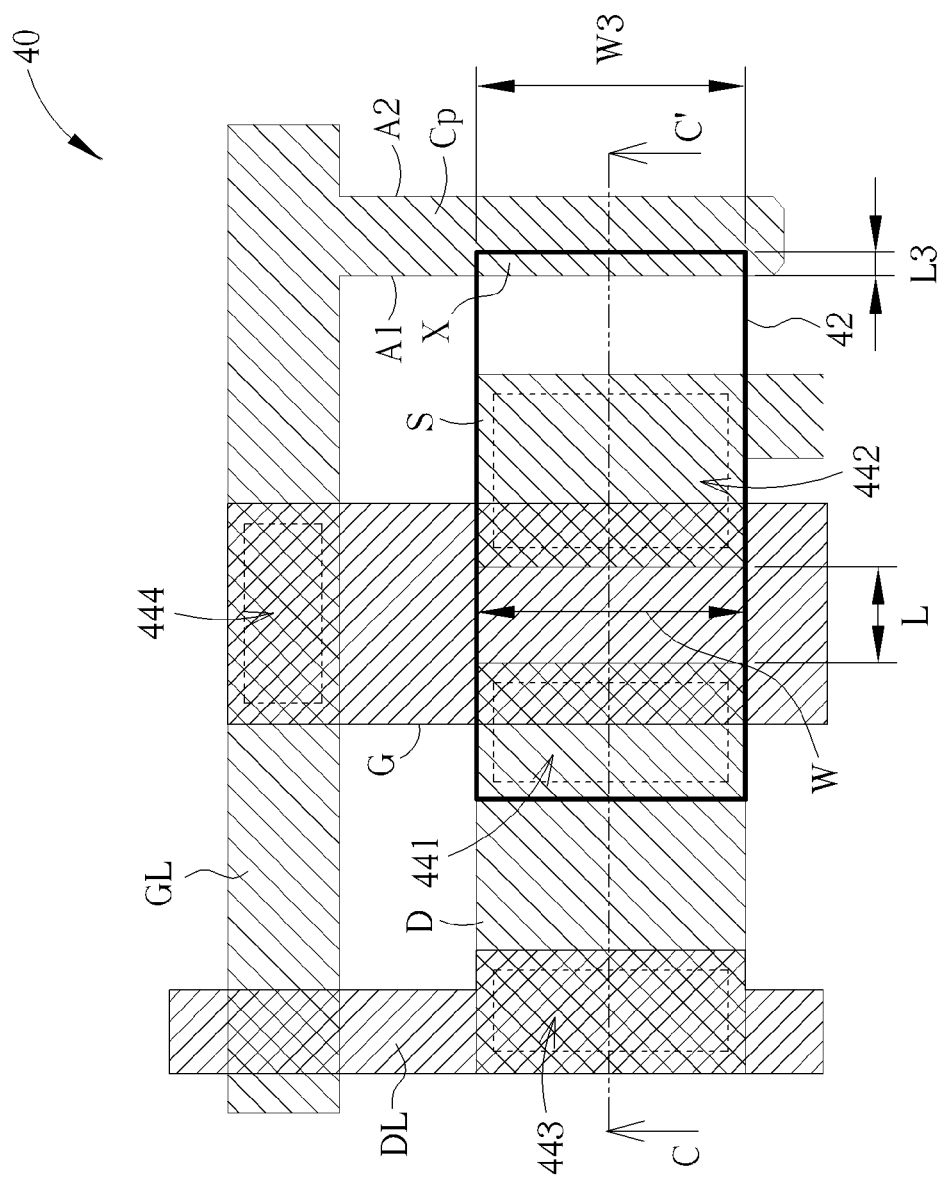
FIG. 4 is a top-view schematic diagram illustrating a thin-film transistor according to a second embodiment of the present disclosure.
Figure 5:
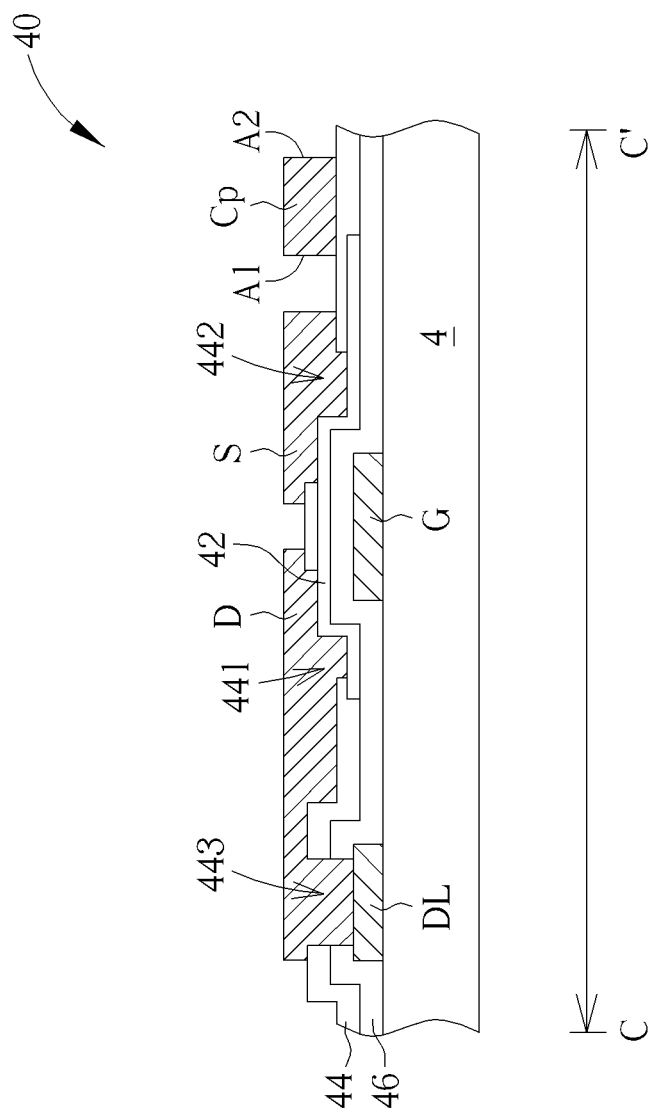
FIG. 5 is a cross-sectional view diagram taken along a cross-sectional line C-C' in FIG. 4.

Refer to FIGS. 4-5. FIG. 4 is a top-view schematic diagram illustrating a thin-film transistor according to a second embodiment of the present disclosure. FIG. 5 is a cross-sectional view diagram taken along a cross-sectional line C-C' in FIG. 4. As shown in FIGS. 4-5, the thin-film transistor 40 of this embodiment includes a gate electrode G, a capacitance compensation structure Cp, a semiconductor layer 42, a dielectric layer 44 (not shown in FIG. 4), a drain electrode D, a source electrode S and an insulation layer 46 (not shown in FIG. 4). The gate electrode G is disposed on a substrate 4 and is connected to a gate line GL. The insulation layer 46 is disposed on the substrate 4. The insulation layer 46 covers the gate electrode G and a data line DL. The capacitance compensation structure Cp is disposed on the substrate 4. The capacitance compensation structure Cp is electrically connected to the gate electrode G. The capacitance compensation structure Cp has a first side A1 and a second side A2. The first side A1 faces the gate electrode G, and the second side A2 is facing away from the gate electrode G. The semiconductor layer 42 is disposed on the substrate 4. The semiconductor layer 42 covers a portion of the gate electrode G. The semiconductor layer 42 extends to overlap at least the first side A1 of the capacitance compensation structure Cp. The dielectric layer 44 is disposed on the substrate 4. The dielectric layer 44 has a first opening 441 and a second opening 442. Both of the first opening 441 and the second opening 442 expose a portion of the semiconductor layer 42 overlapping the gate electrode G respectively. The drain electrode D is disposed on the substrate 4. The drain electrode D is in contact with the semiconductor layer 42 though the first opening 441. The source electrode S is disposed on the substrate 4. The source electrode S is in contact with the semiconductor layer 42 though the second opening 442. The dielectric layer 44 further has a third opening 443 and a fourth opening 444 (not shown in FIG. 5). The third opening 443 penetrates the insulation layer 46 to expose the data line DL. The fourth opening 444 penetrates the insulation layer 46 to expose the gate line GL. The drain electrode D is in contact with and electrically connected to the data line DL through the third opening 443. The gate electrode GL is in contact with and electrically connected to the gate line GL through the fourth opening 444. In this embodiment, both the gate electrode G and the data line DL are formed from the same patterned conductive layer, for example, the first metallic layer (M1). The gate line GL, the capacitance compensation structure Cp, the source electrode S and the drain electrode D are formed from another patterned conductive layer, for example, the second metallic layer (M2), but not limited thereto. For example, in other variant embodiments, the gate line GL and the gate electrode G may be formed from the same patterned conductive layer, for example, the first metallic layer (M1). In this case, the fourth opening 444 may be omitted, while the capacitance compensation structure Cp, the source electrode S, the drain electrode D and the data line DL may be formed from another patterned conductive layer, for example, the second metallic layer (M2). The material of the semiconductor layer 42 may be exemplarily embodied as oxide semiconductors, amorphous semiconductors, polycrystalline semiconductors, microcrystalline semiconductors, single crystalline semiconductors, nanocrystalline semiconductors, organic semiconductors, other suitable semiconductors material, or the combination thereof. Preferably, oxide semiconductors are exemplarily embodied as indium gallium zinc oxide. The material of the insulation layer 46 and dielectric layer 44 may be all kinds of inorganic isolation materials, organic isolation materials or the mixtures of inorganic isolation materials and organic isolation materials. The insulation layer 46 serves as the gate insulation layer. The dielectric layer 44 covers the semiconductor layer 42 so as to avoid damage to the semiconductor layer 42 when the source electrode S and the drain electrode D are etching.

In this embodiment, the semiconductor layer 42 extends to overlap the first side A1 of the capacitance compensation structure Cp, while the source electrode S does not overlap the capacitance compensation structure Cp. However, the present disclosure is not limited to this. In other variant embodiments, the semiconductor layer 42 may extend to the second side A2 of the capacitance compensation structure Cp or protrude from the second side A2. It is worth noting that, even in these cases, the source electrode S does not overlap the capacitance compensation structure Cp. There is an overlap region X in the overlap between the semiconductor layer 42 and the first side A1 of the capacitance compensation structure Cp. An orthogonal projection of the overlap region X on the substrate 4 has a length L3 and a width W3. The length L3 is preferably greater than the misalignments of the semiconductor layer 42. For example, in this embodiment, the length L3 is substantially in a range between 1 micrometer and 5 micrometers, but not limited thereto. The semiconductor layer 42 has a channel length L and a channel width W. The channel length L is defined as the length of the semiconductor layer 42 in the current direction (or the direction of the flow of negative charges). In other words, the channel length L is the length of the semiconductor layer 42 between the source electrode S and the drain electrode D, and the channel width W is the width of the semiconductor layer 42 in the direction perpendicular to the channel length L substantially. The length L3 of the overlap region X is substantially the length in the direction parallel to the direction of the channel length L of the semiconductor layer 42. Since the capacitance compensation structure Cp is electrically connected to the gate line GL, and since the semiconductor layer 42 is electrically connected to the source electrode S, the mutual capacitance between the capacitance compensation structure Cp and the semiconductor layer 42 mainly depends on the overlapping area of the overlap region X between the semiconductor layer 42 and the capacitance compensation structure Cp. Accordingly, even if there is a variation in the position of the semiconductor layer 42 owing to fabrication misalignments, the overlapping area of the overlap region X between the semiconductor layer 42 and the capacitance compensation structure Cp can remain constant. In other words, the mutual capacitance (Cgs) between the gate electrode G and the source electrode S remains constant, thereby providing stable and even component properties for the thin-film transistor 40.

Thin-film transistors are not restricted to the preceding embodiments in the present disclosure. Other embodiments or modifications will be detailed in the following description. In order to simplify and show the differences or modifications between the following embodiments and the above-mentioned embodiment, the same numerals denote the same components in the following description, and the similar parts are not detailed redundantly.

Figure 6:
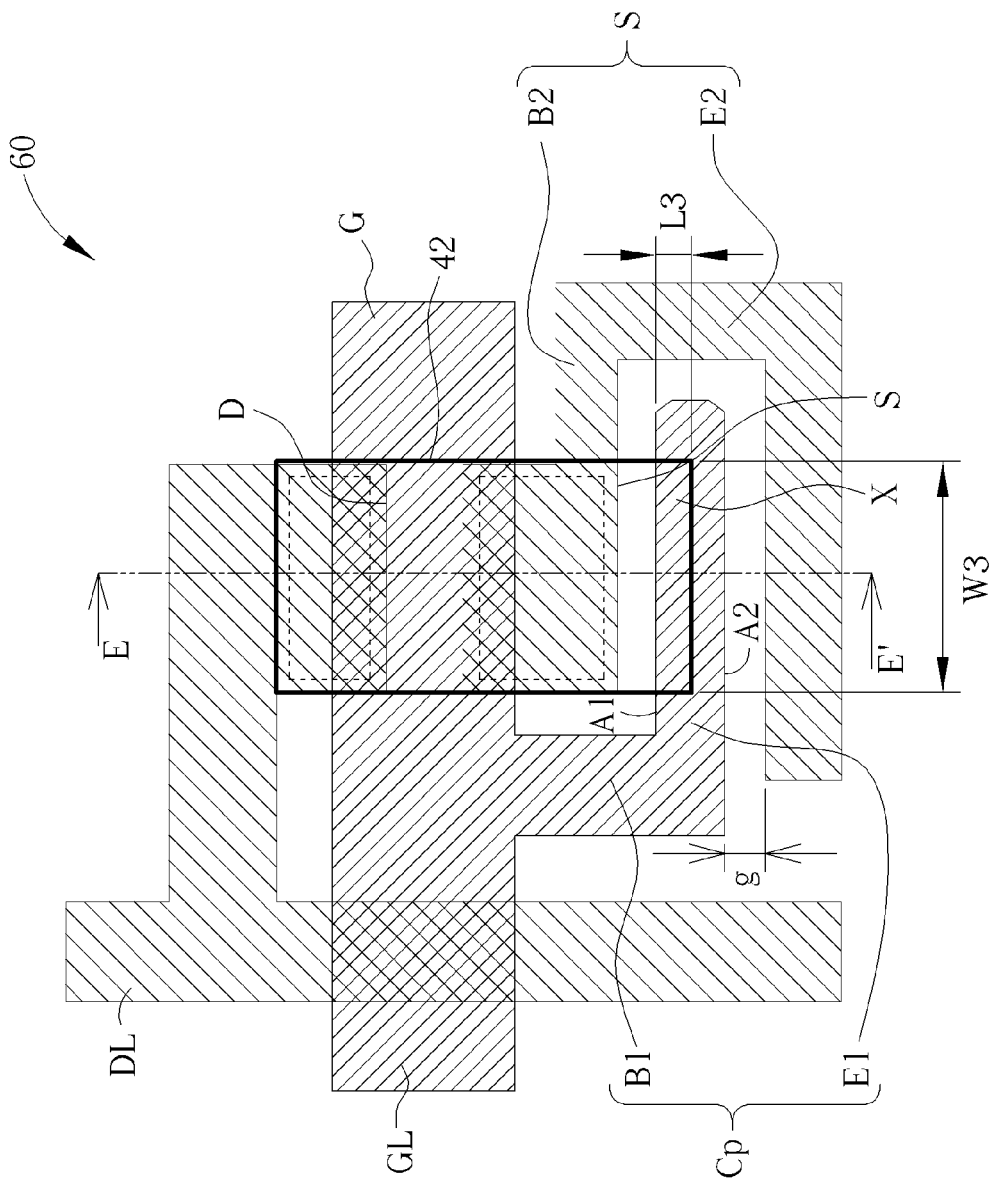
FIG. 6 is a top-view schematic diagram illustrating a thin-film transistor according to a variant of the second embodiment of the present disclosure.
Figure 7:
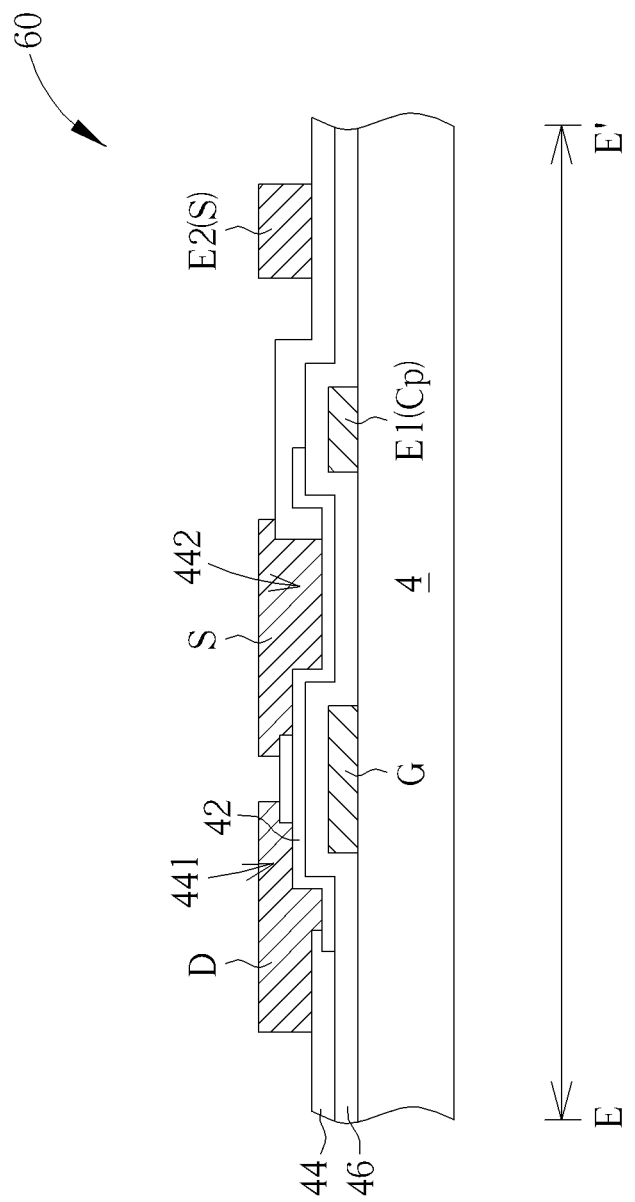
FIG. 7 is a cross-sectional view diagram taken along a cross-sectional line E-E' in FIG. 6.

Refer to FIGS. 6-7. FIG. 6 is a top-view schematic diagram illustrating a thin-film transistor according to a variant of the second embodiment of the present disclosure. FIG. 7 is a cross-sectional view diagram taken along a cross-sectional line E-E' in FIG. 6. As shown in FIGS. 6-7, the thin-film transistor 60 of this embodiment includes a gate electrode G, a capacitance compensation structure Cp, a semiconductor layer 42, a dielectric layer 44 (not shown in FIG. 6), a drain electrode D, a source electrode S and an insulation layer 46 (not shown in FIG. 6). The capacitance compensation structure Cp has a first extension portion E1 and a first body portion B1 (not shown in FIG. 7). The first body portion B1 connects the first extension portion E1 to the gate line GL. The first body portion B1 and the first extension portion E1 form an L shape, but not limited thereto. It may be other kinds of shapes in other embodiments, for example, an approximately curved shape, an approximately F shape, or other suitable shapes. The source electrode S has a second extension portion E2 and a second body portion B2 (not shown in FIG. 7). The second body portion B2 is connected to the second extension portion E2. The second body portion B2 is approximately rectangular, while the second extension portion E2 is an approximately L shape, but not limited thereto. The first extension portion E1 is substantially parallel to the second extension portion E2. An orthogonal projection of the first extension portion E1 and the second extension portion E2 on the substrate 4 has a gap g. The gap g is substantially the length in the direction parallel to the direction of the channel length L of the semiconductor layer 42. The gap g is substantially in a range between 6 micrometers and 8 micrometers, but not limited thereto. In this embodiment, the gate electrode G, the gate line GL and the capacitance compensation structure Cp are formed from the same patterned conductive layer, for example, the first metallic layer (M1). The data line DL, the source electrode S and the drain electrode D are formed from another patterned conductive layer, for example, the second metallic layer (M2), but not limited thereto. For example, in other variant embodiments, the data line DL and the gate electrode G may be formed from the same patterned conductive layer, for example, the first metallic layer (M1), while the capacitance compensation structure Cp, the source electrode S, the drain electrode D and the gate line GL may be formed from another patterned conductive layer, for example, the second metallic layer (M2).

In this embodiment, the first side A1 of the capacitance compensation structure Cp is the side in which the first extension portion E1 faces the gate electrode G, and the second side A2 of the capacitance compensation structure Cp is the other side facing away from the gate electrode G. The semiconductor layer 42 extends to overlap the first side A1 of the capacitance compensation structure Cp, while the source electrode S does not overlap the capacitance compensation structure Cp. However, the present disclosure is not limited to this. In other variant embodiments, the semiconductor layer 42 may extend to the second side A2 of the capacitance compensation structure Cp or protrude from the second side A2. It is worth noting that, even in these cases, the source electrode S does not overlap the capacitance compensation structure Cp. Besides, there is an overlap region X in the overlap between the semiconductor layer 42 and the first side A1 of the first extension portion E1 of the capacitance compensation structure Cp. An orthogonal projection of the overlap region X on the substrate 4 has a length L3 and a width W3. The length L3 is preferably greater than the misalignments of the semiconductor layer 42. The length L3 of the overlap region X is substantially the length in the direction parallel to the channel length L of the semiconductor layer 42. For example, in this embodiment, the length L3 is substantially in a range between 1 micrometer and 5 micrometers, but not limited thereto.

The thin-film transistor in the present disclosure can be applied to pixel structures and periphery circuits in all types of display panels, or any other type of electrical device in which the capacitance must be constant.

To sum up, since both the pixel structures and the thin-film transistors have the capacitance compensation structure in the present disclosure, the offset patterns caused by misalignments have little influence on the capacitance. Therefore, the capacitance remains constant to provide even device properties for all of the thin-film transistors, and the display quality of the pixel structure is effectively enhanced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A thin-film transistor, comprising:
   a gate electrode disposed on a substrate and connected to a gate line;
   a capacitance compensation structure disposed on the substrate, wherein the capacitance compensation structure is electrically connected to the gate electrode, and the capacitance compensation structure has a first side facing the gate electrode and a second side facing away from the gate electrode;
   a semiconductor layer disposed on the substrate, wherein the semiconductor layer covers a portion of the gate electrode, and the semiconductor layer at least extends to overlap the first side of the capacitance compensation structure;
   a dielectric layer disposed on the substrate, wherein the dielectric layer has a first opening and a second opening, and both of the first opening and the second opening expose a portion of the semiconductor layer overlapping the gate electrode respectively;
   a drain electrode disposed on the substrate and in contact with the semiconductor layer though the first opening; and
   a source electrode disposed on the substrate and in contact with the semiconductor layer though the second opening.

2. The thin-film transistor according to claim 1, wherein there is an overlap region in an overlap between the semiconductor layer and the first side of the capacitance compensation structure, an orthogonal projection of the overlap region on the substrate has a length and a width, and the length is substantially in a range between 1 micrometer and 5 micrometers.

3. The thin-film transistor according to claim 1, wherein the capacitance compensation structure has a first extension portion and a first body portion connecting the first extension portion to the gate line.

4. The thin-film transistor according to claim 3, wherein the source electrode has a second extension portion and a second body portion connecting the second extension portion to the gate line.

5. The thin-film transistor according to claim 4, wherein the first extension portion is substantially parallel to the second extension portion, an orthogonal projection of the first extension portion and the second extension portion on the substrate has a gap, and the gap is substantially in a range between 6 micrometers and 8 micrometers.

6. The thin-film transistor according to claim 1, wherein a material of the semiconductor layer comprises oxide semiconductor.

7. The thin-film transistor according to claim 1, wherein the source electrode does not overlap the capacitance compensation structure.

* * * * *